(12) United States Patent
Mole

(10) Patent No.: US 6,867,643 B2
(45) Date of Patent: Mar. 15, 2005

(54) RAIL-TO-RAIL OPERATIONAL AMPLIFIER CIRCUITS TO EXTRACT THE MEAN (COMMON MODE) VOLTAGE OF TWO INPUT SIGNALS

(75) Inventor: Peter J. Mole, St. Albans (GB)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/733,710

(22) Filed: Dec. 11, 2003

(65) Prior Publication Data

US 2004/0207449 A1 Oct. 21, 2004

Related U.S. Application Data

(60) Provisional application No. 60/463,070, filed on Apr. 15, 2003.

(51) Int. Cl.[7] .................................................. G06G 7/12
(52) U.S. Cl. ........................ 327/561; 327/562; 327/563; 330/258
(58) Field of Search .............................. 327/63–67, 72, 327/73, 77, 560–563; 330/253, 258

(56) References Cited

U.S. PATENT DOCUMENTS

| 4,797,631 | A | * | 1/1989 | Hsu et al. ..................... 330/253 |
| 6,150,883 | A | * | 11/2000 | Ivanov ......................... 330/253 |
| 6,356,153 | B1 | * | 3/2002 | Ivanov et al. ................ 330/253 |
| 2002/0084838 | A1 | * | 7/2002 | Martin et al. ................ 327/560 |

* cited by examiner

*Primary Examiner*—Long Nguyen
(74) *Attorney, Agent, or Firm*—Fliesler Meyer LLP

(57) ABSTRACT

A rail-to-rail operational amplifier to extract a true mean of two signals. The amplifier includes a first amplifier input stage adapted to operate when a mean of the two signals is near an upper rail voltage. A second amplifier input stage is adapted to operate when the mean of the two signals is near a lower rail voltage. A transitioning circuit is adapted to control how much each of the first and the second amplifier input stages contributes to an input of a high-gain amplifier output stage. An output of the high-gain amplifier output stage is fed back to both the n-type amplifier input stage and the p-type amplifier input stage via a matched buffer stage.

18 Claims, 3 Drawing Sheets

US 6,867,643 B2

RAIL-TO-RAIL OPERATIONAL AMPLIFIER CIRCUITS TO EXTRACT THE MEAN (COMMON MODE) VOLTAGE OF TWO INPUT SIGNALS

PRIORITY CLAIM

This application claims priority under 35 U.S.C. 119(e) to U.S. Provisional Patent Application No. 60/463,070, filed Apr. 15, 2003, entitled "RAIL-TO-RAIL OPERATIONAL AMPLIFIER CIRCUITS TO EXTRACT THE MEAN (COMMON MODE) VOLTAGE OF TWO INPUT SIGNALS," which is incorporated herein by reference.

FIELD OF THE INVENTION

The present invention relates to operational amplifiers, and more particularly to the use of an operational amplifier to extract the common mode voltage from two inputs.

BACKGROUND OF THE INVENTION

Transmission systems often use a twisted pair to carry signal information as a difference signal. In such systems, it is useful to generate a mean (i.e., common mode) of the voltages that can vary from rail-to-rail, with a difference signal that can vary independently, but is bounded. The impedance presented to the inputs should be high, e.g., greater than 1MΩ. Additionally, the speed of response should be high, e.g., much greater than a 10 MHz bandwidth.

SUMMARY OF PRESENT INVENTION

Embodiments of the present invention relate to operational amplifiers that include rail-to-rail input stages, and more generally to rail-to-rail operational amplifiers. More specifically, embodiments of the present invention relate to rail-to-rail operational amplifiers that extract a true mean of two signals (e.g., of a differential signal).

In accordance with an embodiment, an amplifier circuit includes an n-type buffer input stage that receives the two signals and produces a first offset common mode output signal therefrom. An n-type amplifier input stage receives both the first offset common mode output signal and a first feedback signal, and produces a first differential error signal therefrom. The amplifier circuit also includes a p-type buffer input stage that receives the two signals and produces a second offset common mode signal therefrom. A p-type amplifier input stage receives both the second offset common mode output signal and a second feedback signal, and produces a second differential error signal therefrom. A differential input high-gain amplifier output stage receives the first and second differential error signals and produces a true common mode output signal that is substantially equal to the true mean of the two signals. A feedback stage receives the true common mode output signal and produces the first and second feedback signals therefrom, which are provided to the amplifier input stages. A transitioning stage controls how much the first differential error signal (from the n-type amplifier input stage) and the second differential signal (from the p-type amplifier input stage) contribute to the differential input of the high-gain amplifier output stage.

In accordance with an embodiment of the present invention, the first and second differential signals are summed together at the differential input of the high-gain amplifier input stage. The transitioning circuit controls how much the first differential error signal and the second differential error signal contribute to the differential input of the high-gain amplifier output stage by controlling how a drive current is split between the n-type amplifier input stage and the p-type amplifier input stage. For example, a first portion of the drive current, which is provided to the n-type amplifier input stage, effects a magnitude of the first differential error signal. Similarly, a second portion of the drive current, which is provided to the p-type amplifier input stage, effects a magnitude of the second differential error signal.

Further embodiments, and the features, aspects, and advantages of the present invention will become more apparent from the detailed description set forth below, the drawings and the claims.

DETAILED DESCRIPTION

Figure 1:
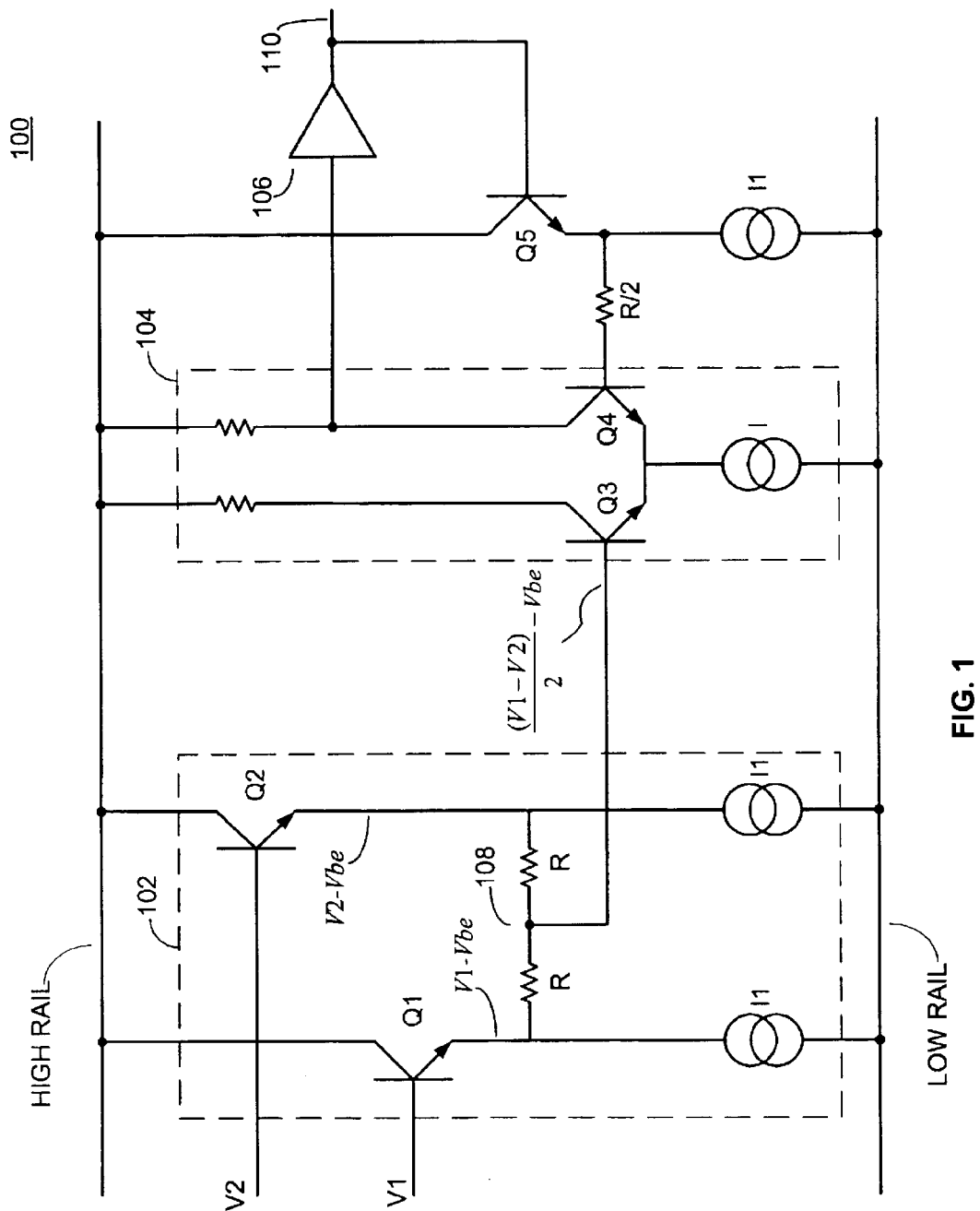
FIG. 1 shows an operational amplifier circuit that allows the input voltages to approach the upper rail voltage, but not the lower rail voltage.

FIG. 1 shows a circuit 100 for an operational amplifier. The circuit 100 is shown as including an input buffer stage 102, and amplifier input stage 104 and a high-gain rail-to-rail output stage 106. The input buffer stage 102 is shown as including a pair of NPN transistors Q1 and Q2 that are used to accept inputs V1 and V2, e.g., from a twisted pair cable (not shown). More specifically, a first input voltage V1 is applied to the base of transistor Q1, and a second input voltage V2 is applied to the base of transistor Q2. The collectors of transistors Q1 and Q2 are both connected to the upper (i.e., high) rail. The emitter of transistor Q1 is connected through a pair of resistors (each labeled R) to the emitter of transistor Q2. The emitter of transistor Q1 is also connected to a current source I1. The emitter of transistor Q2 is also connected to another current source I1, which is matched with the other current sources I1. The currents sources I1 and I provide biasing currents.

The input voltages V1 and V2 are each dropped by one Vbe (the voltage drop from the base to emitter) in transistors Q1 and Q2. More specifically, the voltage at the emitter of transistor Q1 is equal to V1–Vbe, and the voltage at the emitter of transistor Q2 is equal to V2–Vbe. If transistors Q1 and Q2 have substantially similar characteristics (i.e., are matched), and the biasing current sources I1 are matched, then the two emitter base voltage drops (Vbe) are matched (i.e., equal). A typical value for Vbe is approximately 0.75 to 0.80 Volts. Assuming the resistors R are matched, this results in the voltage at the midpoint 108 of the resistors R being equal to the average of V1 and V2, less one emitter base voltage drop (Vbe). This is because the voltage at the emitter of transistor Q1 is V1–Vbe, and the voltage at the emitter of transistor Q2 is V2–Vbe. The offset average of these two voltages, produced at the midpoint between the two resistors R, is $$((V1 - Vbe) + (V2 - Vbe))/2 = (V1 + V2)/2 - 2Vbe/2$$

$$= (V1 + V2)/2 - Vbe.$$

This voltage, also referred to herein as the offset common mode voltage, is applied to the base of transistor Q3, as shown in FIG. 1. It should also be noted that transistors Q1 and Q2 boost the impedance presented by averaging resistors R to the input terminals providing voltages V1 and V2.

Transistors Q3 and Q4 form the input stage 104 of a high-gain amplifier. The rest of the gain stage is represented by the amplifier 106, which is a conventional high-gain rail-to-rail output stage, which is well known in the art. The collector of transistor Q4 is coupled to the input of (and thereby provides an input to) the high-gain rail-to-rail output stage 106. The output 110 of the high-gain rail-to-rail output stage 106 is fed back to the base of a transistor Q5. When in equilibrium, the base voltage of transistors Q4 will be brought within a small error (i.e., difference) of the base voltage of transistor Q3, through the operation of the high-gain amplifier 106. The small difference between the voltages at the bases of transistors Q4 and Q3 is amplified by the transistors Q4 and Q3, with the amplified difference being provided at the collector of transistor Q4 to the input of the high-gain amplifier 106.

Ignoring for now the resistor (labeled R/2) between the base of transistor Q4 and the emitter of transistor Q5, it can be appreciated the base of transistor Q5 would be one voltage emitter drop (Vbe) greater than the base of transistor Q4, and thus substantially equal to (V1+V2)/2, which is the desired mean (i.e., true common mode) of signals V1 and V2.

The emitters of transistors Q3 and Q4 are both connected to a current source I. The collectors of transistors Q3 and Q4 are each connected (optionally through load resistors) to the upper rail. These loads (which need not be resistors in actual implementation) are used to pass the output of stage 104 to stage 106. The base of transistor Q4 is connected through a resistor R/2 to the emitter of transistor Q5, as mentioned above. The collector of transistor Q5 is connected to the high rail. The base of transistor Q5 is connected to the output 110 of the high-gain rail-to-rail output stage 106. Transistor Q5 and resistor R/2 of the feedback circuit are preferably matched to the input receiving transistors Q1 and Q2, and the resistors R, respectively, to ensure that the feedback circuit will add the Vbe drop (and any voltage dropped across the resistor R due to the base current in transistor Q3) onto the voltage at the base of transistor Q4, to thereby recover a true average (i.e., true common mode voltage).

Even though bipolar transistors are shown in FIG. 1, this circuit can alternatively include CMOS transistors. However, when using bipolar transistors (as shown) there are currents that will flow out of the bases of transistors Q3 and Q4. To effectively compensate for the base current that flows out of transistor Q3 (and into the two resistors R in the buffer input stage 102), the resistor R/2 is included between the base of transistor Q4 and the emitter of transistor Q5, as explained above. The resistor R/2 is not necessary in a CMOS equivalent circuit. It is also noted that a design parameter of circuit 100 is that the maximum differential signal (i.e., |V1−V2|) is I1*2*R.

Circuit 100 works very well when the input voltages V1 and V2 are positive. More specifically, the output 110 will provide the true average (i.e., true common mode) of inputs V1 and V2, even if V1 and/or V2 are equal to the upper rail voltage. This is because transistors Q1 and Q2 reduce the inputs V1 and V2 by Vbe, causing the maximum inputs voltages at the bases of transistors Q3 and Q4 to be the upper rail voltage less one Vbe, thus allowing for the signal swing required for proper transistor operation. However, when V1 and/or V2 are taken down close to the lower rail voltage, then there is no longer any room for circuit 100 to operate properly. More specifically, as the voltages on the emitters of transistors Q1 and Q2 come down, there is eventually no voltage left to allow the current sources I1 to function, nor is there any voltage left for the current source I (providing a current to the emitters of transistors Q3 and Q4) to function. In other words, when V1 and/or V2 is close to the lower rail voltage, the current source I and/or the current sources I1 enter saturation. So, while circuit 100 will provide full common mode extraction for the upper half (e.g., positive half) of the input range, circuit 100 only works properly when remaining about 2 or 3 Volts above the lower rail voltage.

Based on the above description, it can be appreciated that circuit 100 includes a rail-to-rail amplifier output stage 106, but not a rail-to-rail amplifier input stage. In accordance with embodiments of the present invention, an amplifier input stage is provided that can operate from rail-to-rail.

Figure 2A:
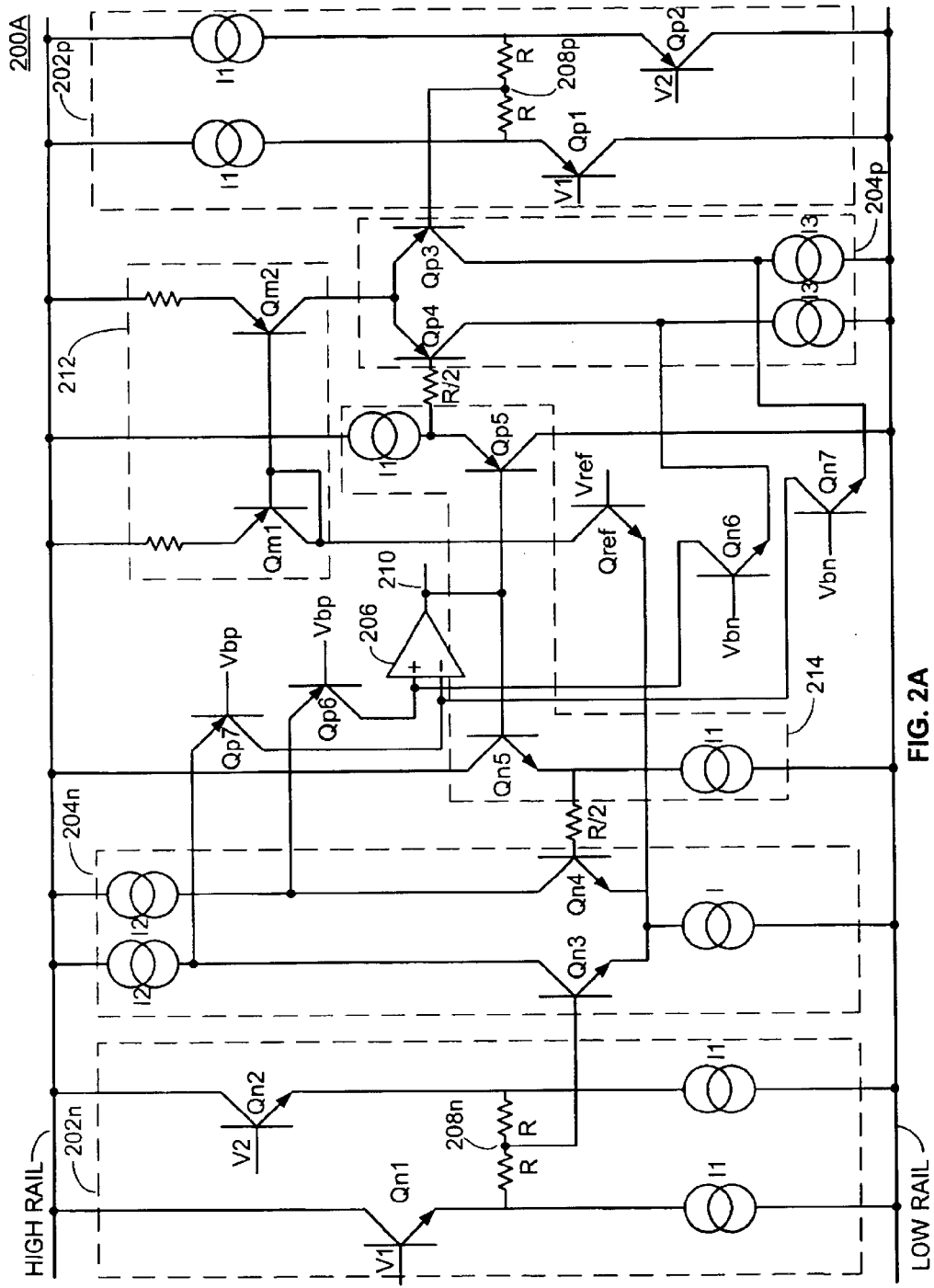
FIG. 2A shows an operational amplifier circuit, according to an embodiment of the present invention, that allows the input voltages to approach both the upper rail voltage and the lower rail voltage.

Referring now to FIG. 2A, a circuit 200A of an operational amplifier, according to an embodiment of the present invention, is shown. The circuit 200A is shown as including an n-type input buffer stage 202n, a p-type input buffer stage 202p, an n-type amplifier input stage 204n, a p-type amplifier input stage 204p, a current mirror 212, and a rail-to-rail high-gain output stage 206. More specifically, output stage 206 can be a conventional high-gain, differential input, trans-impedance amplifier, which receives a differential current input and provides a voltage output. Circuit 200A is also shown as including folded cascode transistors Qp6, Qn6, Qp7, Qn7 and a transitioning transistor Qref, each of which receives a biasing voltage (Vbp, Vbn or Vref). Current sources I, I1, I2 and I3 provide biasing currents. The transitioning transistor Qref is part of a transitioning stage. Circuit 200A also includes a matched feedback buffer stage 214.

The circuit 200A is designed such that the n-type amplifier input stage 204n operates and provides the differential input to the high-gain output stage 206 while (V1+V2)/2 is near the high rail voltage, the p-type amplifier input stage 204p operates and provides the differential input to the high-gain output stage 206 while the (V1+V2)/2 is near the lower rail voltage, and both n-type and p-type input amplifier stages 204n and 204p operate and contribute to the differential input to the high-gain output stage 206 when (V1+V2)/2 is generally in the middle of the upper and lower rail voltages. The voltage Vref specifies when the n-type amplifier input stage 204n and the p-type amplifier input stage 204p begin to swap roles. Thus, Vref can be set at the mid point (i.e., mean) of the upper and lower rails (also referred to as a mid-rail voltage). However, because the n-type amplifier input stage 204n generally operates better than the p-type amplifier input stage 204p, Vref can be set below the mid-rail (so long as it's set about 2 or 3 Volts above the low rail), in accordance with an embodiment of the present invention, so that the n-type amplifier input stage 204n operates over a wider range than the p-type amplifier input stage 204p.

Each input to the n-type input buffer stage 202n is tied to the corresponding input to the p-type input buffer stage 202p. More specifically, in accordance with an embodiment of the present invention, the bases of transistors Qn1 and Qp1 are connected together, as are the bases of transistors Qn2 and Qp2.

The collector of transistor Qn4 is shown as being connected to a first differential input (e.g., the positive input) of the high-gain amplifier output stage 206 through folded cascode transistor Qp6. Similarly, the collector of transistor Qp4 is shown as being connected to the first differential input of the high-gain amplifier output stage 206 through folded cascode transistor Qn6. The collector of transistor Qn3 is shown as being connected to a second differential input (e.g., the negative input) of the high-gain amplifier output stage 206 through folded cascode transistor Qp7. Similarly, the collector of transistor Qp3 is shown as being connected to the second differential input of the high-gain amplifier output stage 206 through folded cascode transistor Qn7. Through this arrangement, the collectors of transistors Qn4 and Qn3 provide a first differential error signal to the differential input of the high-gain amplifier output stage 206, and the collectors of transistors Qp4 and Qp3 provide a further differential input signal to the differential input of the high-gain amplifier output stage 206. These differential error signals are added at the differential input of the high-gain amplifier output stage 206. A true common mode output signal (substantially equal to the true mean of input voltage signals V1 and V2) is then provided at the output 210 of the high-gain amplifier output stage 206. Feedback stage 214, which is preferably a matched buffer stage, receives the common mode output signal and provides feedback signals to the n-type amplifier input stage 204n and the p-type amplifier input stage 204p.

For reasons similar to those discussed above with reference to FIG. 1 (and discussed in more detail below), when the n-type amplifier input stage 204n is fully operating, the voltage at the output 210 of the high-gain amplifier stage 206 (and also, at the base of transistor Qn5) will be substantially equal to the true mean (i.e., true average) of inputs V1 and V2. In other words, the base of transistor Qn5 will equal the common mode voltage for inputs V1 and V2. Similarly, when the p-type amplifier input stage 204p is fully operating, the output 210 of the high-gain amplifier output stage 206 (and also, at the base of transistor Qp5) will equal the common mode voltage for inputs V1 and V2. When the n-type amplifier input stage 204n and the p-type amplifier input stage 204p are both operating, the currents from the collectors of transistors Qn4 and Qp4 are summed (after passing thorough transistors Qp6 and Qn6, respectively) at the first differential input of the high-gain amplifier output stage 206, and the currents from the collectors of transistors Qn3 and Qp3 are summed (after passing thorough transistors Qp7 and Qn7, respectively) at the other differential input of the high-gain amplifier output stage 206, causing the output of the output stage 206 to be the true common mode voltage. Together, the n-type and p-type amplifier input stages 204n and 204p provide a rail-to-rail input stage for the operation amplifier circuit 200A. This is explained in more detail below. The output 210 of the high-gain amplifier output stage 206 is then fed back to both the n-type buffer input stage 204n and the p-type buffer input stage 204p, via the matched buffer feedback stage 214.

When the voltages at the bases of transistors Qn3 and Qn4 are high enough above Vref, the emitters of transistors Qn3 and Qn4 pull up on the emitter of transistor Qref, turning off transistor Qref. This causes all biasing current I (from the current source I) to pass into the n-type amplifier input-stage 204n, powering stage 204n. Meanwhile, when transistor Qref is turned off, no current flows through the current mirror 212, and thus no current is provided to power the transistors Qp3 and Qp4 of the p-type amplifier input stage 204p. In other words, the p-type amplifier input stage 204p is cut-off.

As the voltages at the bases of transistors Qn3 and Qn4 approach Vref, some of the current from the current source I is diverted up through transistor Qref. This reduces the current to the n-type amplifier input stage 204n, and introduces some current that gets mirrored around by current mirror 212 into transistors Qp3 and Qp4 of p-type amplifier input stage 204p. The closer the voltages at the bases of transistors Qn3 and Qn4 are to Vref, the more evenly the current is divided between the n-type amplifier input stage 204n and the p-type amplifier input stage 204p. Then, if the voltages at the bases of transistors Qn3 and Qn4 fall below Vref, more current will be provided to the p-type amplifier input stage 204p than to the n-type amplifier input stage 204n, causing the p-type amplifier input stage 204p to contribute more to the differential input to the high-gain rail-to-rail output stage 206. If the voltages at the bases of transistors Qn3 and Qn4 fall low enough below Vref, then all the current from the current source I will be provided to the p-type amplifier input stage 204p (cutting off the n-type amplifier input stage 204n), causing only the p-type amplifier input stage 204p to contribute to the differential input to the high-gain rail-to-rail output stage 206. The above described transition between the n-type and p-type stages can be referred to as a soft transition. The above described circuit provides a soft transition that is both smooth and continuous. More generally, the above described circuit provides for smooth and continuous rail-to-rail operation.

Figure 2B:
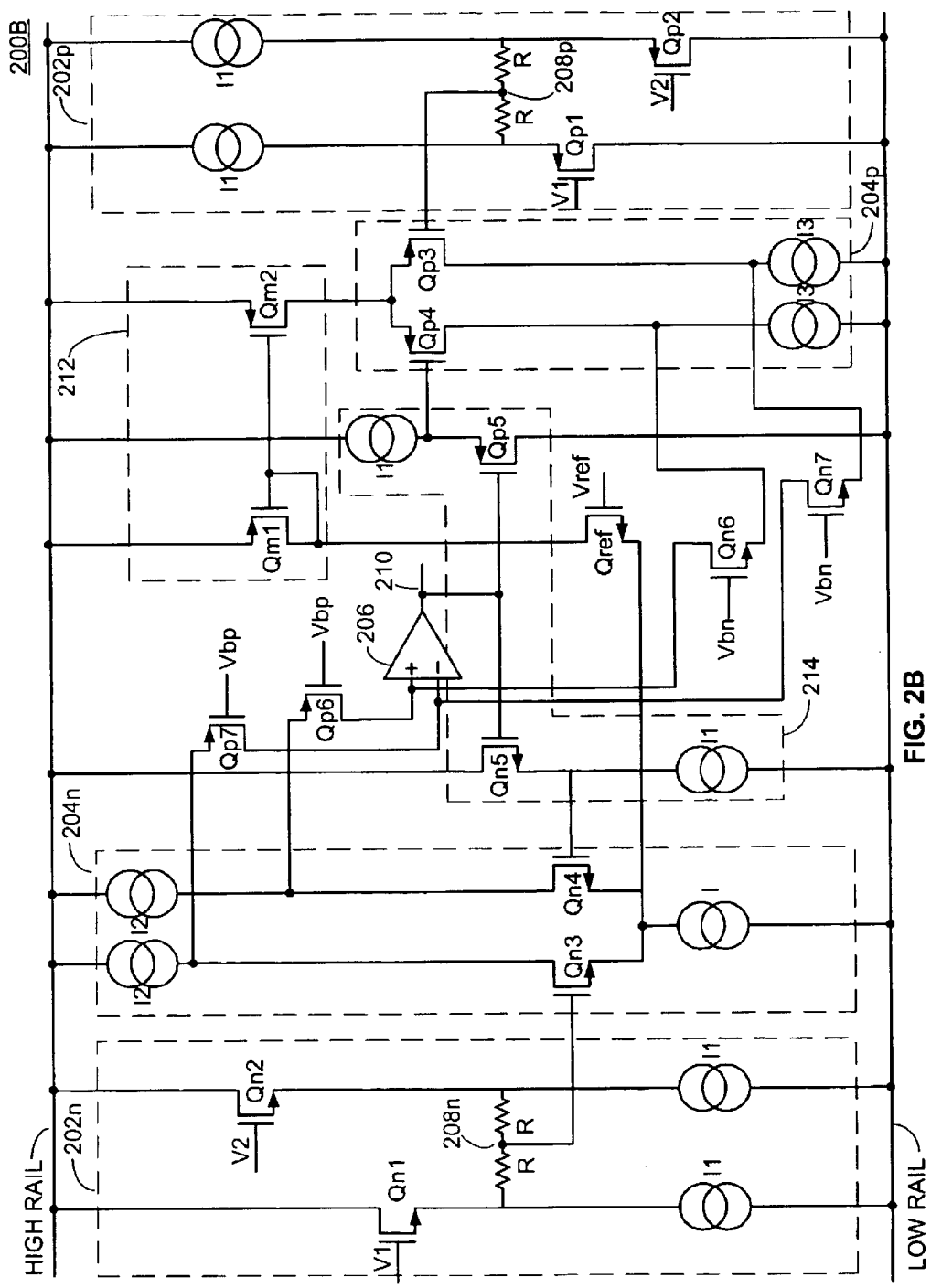
FIG. 2B shows an embodiment of the present invention that is similar to the embodiment of FIG. 2A, except CMOS transistors are used in place of bipolar transistors.

Circuit 200A has been described as including bipolar type transistors. One of ordinary skill in the art will appreciate that other types of transistors, such as, but not limited to complimentary-metal-oxide-semiconductor (CMOS) type transistors (i.e., NMOS and PMOS), can alternatively be used. For example, NMOS transistors can be used for n-type stages, and PMOS transistors can be used for p-type stages. Circuit 200B in FIG. 2B illustrates an embodiment of the present invention that uses CMOS transistors in place of bipolar transistors. As shown in FIG. 2B, the resistors in current mirror 212 are not necessary, but can be included if desired. For best performance, resistors R are included in circuit 200B. Resistors R/2 are not necessary when using CMOS transistors. The operation of circuit 200B is essentially equivalent to the operation of circuit 200A, and therefore need not be described in additional detail.

It is noted that there may be some uses where resistors R can be removed, and the CMOS transistors are appropriately sized. In such a case, the current sources I1 in the n-type input buffer stage 202n would be merged to provide one current source providing a current value of twice I1 (i.e., 2×I1). The current sources I1 in the p-type input buffer state 202p would be similarly merged.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A rail-to-rail operational amplifier circuit to extract a true mean of two signals, comprising:
   an n-type buffer input stage that receives the two signals and produces a first offset common mode output signal therefrom;
   an n-type amplifier input stage that receives both the first offset common mode output signal and a first feedback signal, and produces a first differential error signal therefrom;
   a p-type buffer input stage that receives the two signals and produces a second offset common mode signal therefrom;

a p-type amplifier input stage that receives both the second offset common mode output signal and a second feedback signal, and produces a second differential error signal therefrom;

a differential input high-gain amplifier output stage that receives the first and second differential error signals and produces a true common mode output signal that is substantially equal to the true mean of the two signals;

a feedback stage that receives the true common mode output signal and produces the first and second feedback signals therefrom; and a transitioning stage that controls how much the first differential error signal from the n-type amplifier input stage and the second differential signal from the p-type amplifier input stage contribute to the differential input of the high-gain amplifier output stage.

2. The circuit of claim 1, wherein the two signals comprise a differential signal.

3. The circuit of claim 1, wherein feedback stage comprises a matched buffer stage.

4. The circuit of claim 1, wherein the transitioning circuit controls how a drive current is split between the n-type amplifier input stage and the p-type amplifier input stage.

5. The circuit of claim 4, wherein:

a first portion of the drive current is provided to the n-type amplifier input stage and effects a magnitude of the first differential error signal; and a second portion of the drive current is provided to the p-type amplifier input stage and effects a magnitude of the second differential error signal.

6. The circuit of claim 5, wherein the first and second differential error signals are added at the differential input of the high-gain amplifier output stage.

7. The circuit of claim 6, wherein the n-type buffer input stage (202n) includes:

a first n-type transistor (Qn1) having a base forming a first input, a collector connected to a high rail potential, and having an emitter;

a first current source connecting the emitter of the first n-type transistor (Qn1) to a low rail potential;

a second n-type transistor (Qn2) having a base forming a second input, a collector connected to the high rail potential, and having an emitter;

a second current source connecting the emitter of the second n-type transistor (Qn2) to the low rail potential; and a first pair of resistors connected in series between the emitter of the first n-type transistor (Qn1) and the emitter of the second n-type transistor (Qn2);

wherein the first offset common mode output signal is produced between the first pair of resistors.

8. The circuit of claim 7, wherein the p-type buffer input stage (202p) includes:

a first p-type transistor (Qp1) having a base connected to the base of the first n-type transistor (Qn1), a collector connected to the low rail potential, and having an emitter;

a third current source connecting the emitter of the first p-type (Qp1) transistor to the high rail potential;

a second p-type transistor (Qp2) having a base connected to the base of the second n-type transistor (Qn2), a collector connected to the low rail potential, and having an emitter;

a fourth current source connecting the emitter of the second p-type transistor (Qp2) to the high rail potential; and a second pair of resistors connected in series between the emitter of the first p-type transistor (Qp1) and the emitter of the second p-type transistor (Qp2);

wherein the second offset common mode output signal is produced between the second pair of resistors.

9. The circuit of claim 8, wherein the n-type amplifier input stage (204n) includes:

a third n-type transistor (Qn3) having a base connected between the first pair of resistors, a collector, and an emitter;

a fourth n-type transistor (Qn4) having an emitter connected to the emitter of the third n-type transistor (Qn3), and having a base and a collector;

a fifth current source connecting the collector of the third n-type transistor (Qn3) to the high rail potential;

a sixth current source connecting the collector of the fourth n-type transistor (Qn4) to the high rail potential;

wherein the base of the third n-type transistor (Qn3) receives the first offset common mode output signal;

wherein the base of the fourth n-type transistor (Qn4) receives the first feedback signal; and wherein the emitters of the third and forth n-type transistors (Qn3 and Qn4) receive the first portion of the drive current; and wherein the collectors of the third and forth n-type transistors (Qn3 and Qn4) provide the differential error signal.

10. The circuit of claim 9, wherein the p-type amplifier input stage (204p) includes:

a third p-type transistor (Qp3) having a base connected between the second pair of resistors, a collector, and an emitter;

a fourth p-type transistor (Qp4) having an emitter connected to the emitter of the third n-type transistor (Qn3), and having a base and a collector;

a seventh current source connecting the collector of the third p-type transistor (Qp3) to the low rail potential;

an eighth current source connecting the collector of the fourth p-type transistor (Qp4) to the low rail potential;

wherein the base of the third p-type transistor (Qp3) receives the second offset common mode output signal;

wherein the base of the fourth p-type transistor (Qn4) receives the second feedback signal;

wherein the emitters of the third and forth p-type transistors (Qp3 and Qp4) receive the second portion of the drive current; and wherein the collectors of the third and forth p-type transistors (Qp3 and Qp4) provide the second differential error signal.

11. The circuit of claim 10, wherein the transitioning circuit includes:

a reference transistor (Qref) having a base receiving a reference voltage, an emitter connected to the emitters of the third and fourth n-type transistors (Qn3 and Qn4), and having a collector; and a current mirror having an input connected to the collector of the reference transistor (Qref) and an output of the current mirror providing the second portion of the drive current to the emitters of the third and fourth p-type transistors (Qp3 and Qp4).

12. The circuit of claim 1, wherein:

the n-type stages include npn transistors; and the p-type stages include pnp transistors.

13. The circuit of claim 1, wherein:
the n-type stages include NMOS transistors; and
the p-type stages include PMOS transistors.

14. A rail-to-rail operational amplifier to extract a true mean of two signals, comprising:
- first and second buffer input stages, each adapted to receive the two signals;
- a first amplifier input stage, coupled to an output of the first buffer input stage, and adapted to operate when a mean of the two signals is near an upper rail voltage;
- a second amplifier input stage, coupled to an output of the second buffer input stage, and adapted to operate when the mean of the two signals is near a lower rail voltage; and
- a transitioning stage adapted to control how much each of the first and the second amplifier input stages contributes to an input of a high-gain amplifier output stage, when a mean of the two signals is between the upper and lower rail voltages; and
- a feedback stage adapted to feed an output of the high-gain amplifier output stage back to the first and second amplifier input stages.

15. The amplifier of claim 14, wherein the two signals comprise a differential signal.

16. A rail-to-rail operational amplifier circuit to extract a true mean of two signals, comprising:
- an n-type buffer input stage that receives the two signals and produces a first offset common mode output signal therefrom;
- an n-type amplifier input stage that receives both the first offset common mode output signal and a first feedback signal, and provides a first differential error signal to a differential input of a high-gain amplifier output stage;
- a p-type buffer input stage that receives the two signals and produces a second offset common mode signal therefrom;
- a p-type amplifier input stage that receives both the second offset common mode output signal and a second feedback signal, and provides a second differential error signal to the differential input of the high-gain amplifier output stage;
- a feedback stage that receives a true common mode output signal from the high-gain amplifier output stage and provides the first and second feedback signals, respectively, to the n-type and p-type amplifier input stages; and
- a transitioning stage that controls magnitudes of the first and second differential error signals.

17. The circuit of claim 16, wherein:
the n-type stages include npn transistors; and
the p-type stages include pnp transistors.

18. The circuit of claim 16, wherein:
the n-type stages include NMOS transistors; and
the p-type stages include PMOS transistors.

* * * * *